(12) United States Patent
Vrijheid

(10) Patent No.: US 6,496,006 B1
(45) Date of Patent: Dec. 17, 2002

(54) MRI APPARATUS PROVIDED WITH ANTI-INTERFERENCE SUPPLY CONDUCTORS FOR ELECTRICAL CONNECTION EQUIPMENT

(75) Inventor: Johan Ernst Willy Vrijheid, Eindhoven (NL)

(73) Assignee: Koninkiljke Philips Electronics N.V., Eindhoven (NL)

( * ) Notice: Subject to any disclaimer, the term of this patent is extended or adjusted under 35 U.S.C. 154(b) by 70 days.

(21) Appl. No.: 09/590,423

(22) Filed: Jun. 8, 2000

(30) Foreign Application Priority Data

Jun. 14, 1999 (EP) .............................. 99201877

(51) Int. Cl.[7] .............................. G01V 3/00; A61B 5/05
(52) U.S. Cl. ...................... 324/318; 324/322; 600/411; 600/422
(58) Field of Search .................. 324/318, 322, 324/300, 309, 307, 319, 320, 321, 315, 314; 333/25; 600/410, 411, 422

(56) References Cited

U.S. PATENT DOCUMENTS

| 4,631,504 A | * 12/1986 | Matsuda et al. ............... 333/25 |
| 5,294,886 A | 3/1994 | Duerr ......................... 324/318 |
| 5,602,478 A | 2/1997 | Salloway et al. ............ 324/318 |
| 6,011,396 A | * 1/2000 | Eckels et al. ................ 324/319 |
| 6,219,570 B1 | * 4/2001 | Mueller et al. .............. 600/410 |
| 2002/0095084 A1 | * 7/2002 | Vrijheid et al. ............. 600/411 |

FOREIGN PATENT DOCUMENTS

| DE | 19749903 A | 5/1999 | ........... G01R/33/28 |
| EP | 0927889 A2 | * 7/1999 | |
| EP | WO 00/77926 A1 | * 12/2000 | |
| FR | 2685989 | 7/1993 | ........... H03H/11/00 |
| JP | 4-01-308533 | * 12/1989 | |

* cited by examiner

*Primary Examiner*—Edward Lefkowitz
*Assistant Examiner*—Tiffany A. Fetzner
(74) *Attorney, Agent, or Firm*—John Vodopia

(57) ABSTRACT

In medical MRI apparatus it is often desirable to maintain a connection with the patient 58 to be examined, for example in order to observe the patient by means of a television camera 62 or to monitor physical functions like the heart rate or blood pressure. It is often necessary to use electrically powered connection equipment 62, 64 which is located in or very close to the imaging area, the supply lines 66, 68 also being located in the imaging area so that the (precisely defined) fields required for imaging would be disturbed thereby. According to the invention the supply lines are subdivided into segments 72-i, each of which has a length shorter than ¼ of the wavelength of the RF field; these segments are separated from one another by inductances 74-i. Consequently, the supply line does not present itself as an energy absorbing conductor to the RF field, so that the RF field is not disturbed thereby. Distortion of the uniform B field is avoided by twisting the conductors 78, 80 of the line and by winding the inductances in a bifilarr winding mode.

11 Claims, 2 Drawing Sheets

MRI APPARATUS PROVIDED WITH ANTI-INTERFERENCE SUPPLY CONDUCTORS FOR ELECTRICAL CONNECTION EQUIPMENT

BACKGROUND OF THE INVENTION

The invention relates to an MRI apparatus for forming an image of an object to be examined in a measuring volume of the apparatus, which apparatus includes a field magnet for generating a uniform field in the measuring volume of the apparatus, an RF transmission aerial for transmitting RF radiation of a given wavelength to the object to be examined, and electrical connection equipment for maintaining a connection with the object to be examined, said connection equipment being coupled to a region outside the measuring volume by means of a conductor provided with frequency-dependent elements.

An apparatus of this kind is known from U.S. Pat. No. 5,602,478. As is customary for MRI equipment, the object to be examined according to the cited patent is formed by a patient; a part of the body of such a patient is to be imaged. As is generally known, the generation of the electromagnetic fields causes an unpleasant noise in MRI equipment. In order to suppress such noise, the known MRI apparatus is provided with electrical connection equipment for maintaining a connection with the patient, the connection equipment in said known apparatus being formed by a headset whereby anti-noise is produced. The headset is coupled to a signal generator which is situated in the region outside the measuring volume. Said coupling is realized via an electrical conductor which consists of two cores and a conductive envelope. In order to prevent undesirable influencing of the imaging by means of the MRI apparatus, the conductor is provided with frequency-dependent elements in the form of a filter circuit which includes a number of filters tuned to a number of frequencies of the RF radiation. Each of these filters is formed as a series connection of an inductance and a capacitor and is arranged between a ground point and a point of the associated conductor which is situated at such a distance from the headset that this distance corresponds to ¼ wavelength of the RF radiation whereto the relevant filter is tuned. This means that the interference-suppressing effect of said filters is effective for a few, predetermined frequencies only.

The headset used in the known apparatus is a passive element, i.e. the headset does not receive electrical power from outside the measuring volume. However, there is an increasing need for electrical connection equipment for maintaining a connection with the patient to be examined which is capable of receiving electrical power supply energy, such as sensors for monitoring the physical condition of the patient or a TV camera for observing the patient, and the associated lighting.

OBJECTS AND SUMMARY OF THE INVENTION

It is an object of the invention to provide an MRI apparatus of the kind set forth wherein electrical connection equipment with active elements can be used without causing a disturbance of the image for a wide range of radio frequencies used in the apparatus. To this end, the MRI apparatus according to the invention is characterized in that the conductor which couples the connection equipment to the region outside the measuring volume is constructed as a low-frequency conductor for the supply signals of low frequency, relative to the frequency of the RF radiation, to and from the connection equipment, said low-frequency conductor including segments (72-$i$) which are separated from one another and each of which is shorter than ¼ of the wavelength of said RF radiation, the separation between the segments being realized by frequency-dependent separating elements which constitute a conductor for said low frequencies and an isolator for RF alternating current.

Taking these steps allows for the use of active connection equipment which is fed via a conductive connection, no disturbing effect being exerted by the low-frequency conductors for as long as the segments are significantly shorter than the wavelength of the RF radiation used in the MRI apparatus.

Each of the separated segments in an advantageous embodiment of the invention is shorter than 1/20 of the wavelength of said RF radiation. It has been found in practice that such a choice of the length of the segments results in an effect on the MR image which is negligibly small for all practical purposes.

The separating elements in a further embodiment of the invention are formed by inductances which do not contain a ferromagnetic material.

As a result of this step, field concentration in the inductance elements cannot exert an adverse effect on the homogeneity and/or the strength of the homogeneous field generated by the MRI apparatus.

The inductances in another embodiment of the invention are formed in that the input core and the output core in the low-frequency conductor are wound so as to form bifilar wound coils.

As a result of this step, the input core and the output core in the low-frequency conductor will not generate a field outside the inductance elements which could have an adverse effect on the homogeneity and/or the strength of the homogeneous field generated by the MRI apparatus.

The segments in another embodiment of the invention are formed by mutually twisted cores.

As a result of this step, the input and output cores in the low-frequency conductor again will not generate a field which would have an adverse effect on the homogeneity and/or the strength of the homogeneous field generated by the MRI apparatus.

The invention will be described in detail hereinafter with reference to the Figures in which corresponding elements are denoted by corresponding reference numerals.

Therein:

DESCRIPTION OF THE PREFERRED EMBODIMENTS

Figure 1:
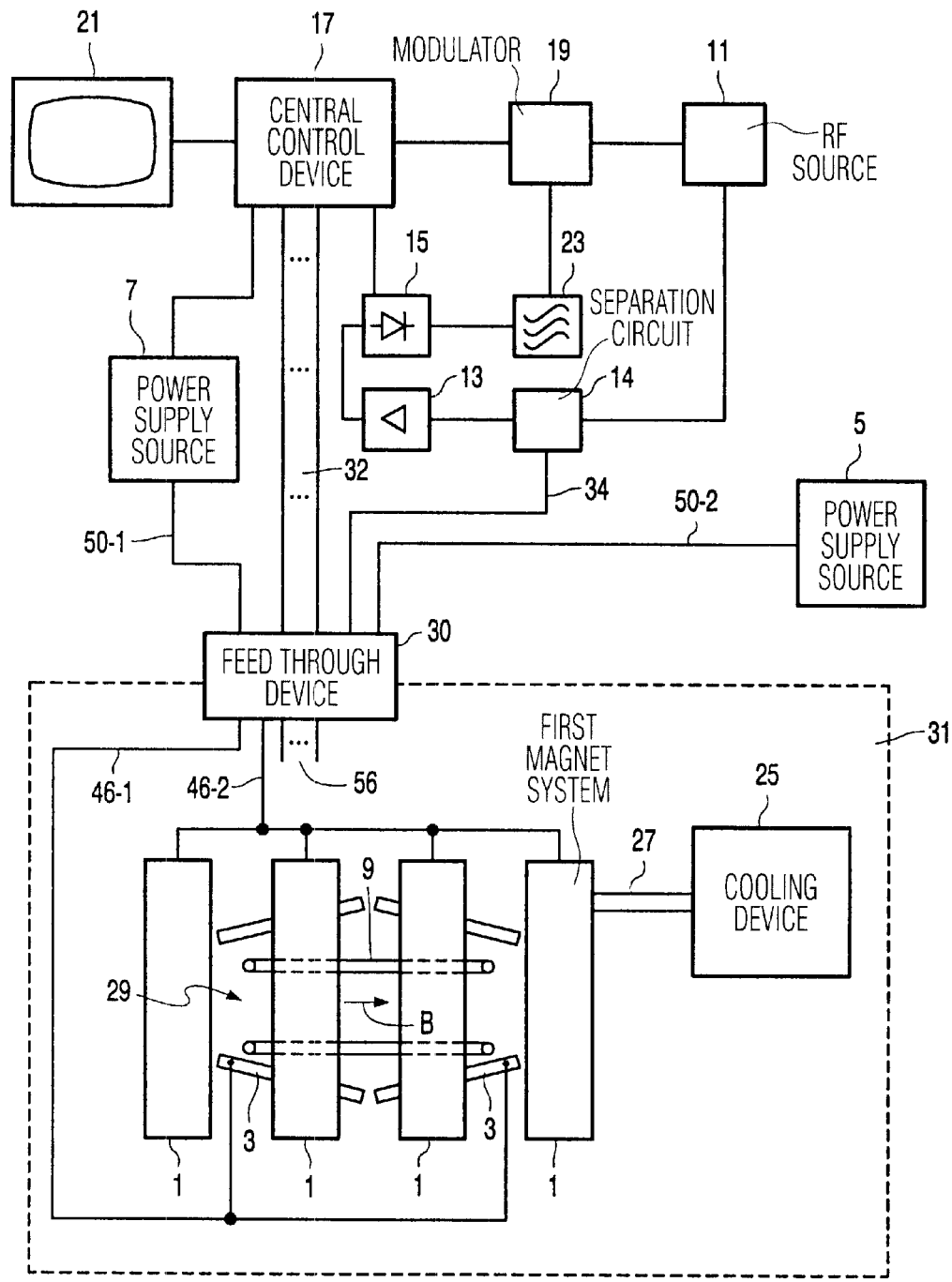
FIG. 1 is a diagrammatic representation of the general construction of a magnetic resonance imaging apparatus in which the invention can be used.

The magnetic resonance imaging apparatus shown in FIG. 1 includes a first magnet system 1 for generating a uniform, steady magnetic field B, a second magnet system 3 for generating magnetic gradient fields, a power supply source 5 for the first magnet system 1, and a power supply source 7 for the second magnet system 3. An RF coil 9 serves to generate an RF magnetic alternating field; to this end it is connected to an RF transmission device which includes an RF source 11. The RF coil 9 can also be used for the detection of spin resonance signals generated by the RF transmission field in an object to be examined (not shown); to this end, the RF coil is connected to an RF receiving device which includes a signal amplifier 13. The output of the signal amplifier 13 is connected to a detector circuit 15 which is connected to a central control device 17. The central control device 17 also controls a modulator 19 for the RF source 11, the power supply source 7 and a monitor 21 for display. An RF oscillator 23 controls the modulator 19 as well as the detector 15 which processes the measuring signals. The forward and return RF signal traffic are separated from one another by a separation circuit 14. A cooling device 25 with cooling ducts 27 serves to cool the magnet coils of the first magnet system 1. The RF coil 9, arranged within the magnet systems 1 and 3, encloses a measuring volume 29 which is large enough to enclose a patient to be examined or a part of a patient to be examined, for example the head and the neck, in an apparatus for forming medical images. Thus, a steady magnetic field B, gradient fields which select object slices, and a spatially uniform RF alternating field can be generated in the measuring volume 29. The RF coil 9 is capable of combining the functions of transmitter coil and measuring coil. It is also possible to use different coils for these two functions; for example, surface coils then act as measuring coils. The assembly formed by the coils 1, the coil 9 and the second magnet system (gradient coils) 3 is enclosed by an RF-field shielding Faraday cage 31.

A supply line 50-1 extends from the power supply source 7 to the feedthrough device 30; furthermore, a supply line 50-2 extends from the power supply source 5 to the feedthrough device 30. The central control device 17 and the various parts to be controlled (not shown) in the MRI apparatus within the Faraday cage 31 are interconnected by way of connection leads 32 which are connected to such parts to be controlled via the feedthrough device 30. Furthermore, an RF connection line 34 is arranged between the separation circuit 14 and the feedthrough device. Inside the Faraday cage the supply line 50-1 continues as a connection lead 46-1 and the supply line 50-2 continues as a connection lead 46-2. The bundle of connection leads 32 continues as a bundle of connection lines 56 within the Faraday cage.

Figure 2:
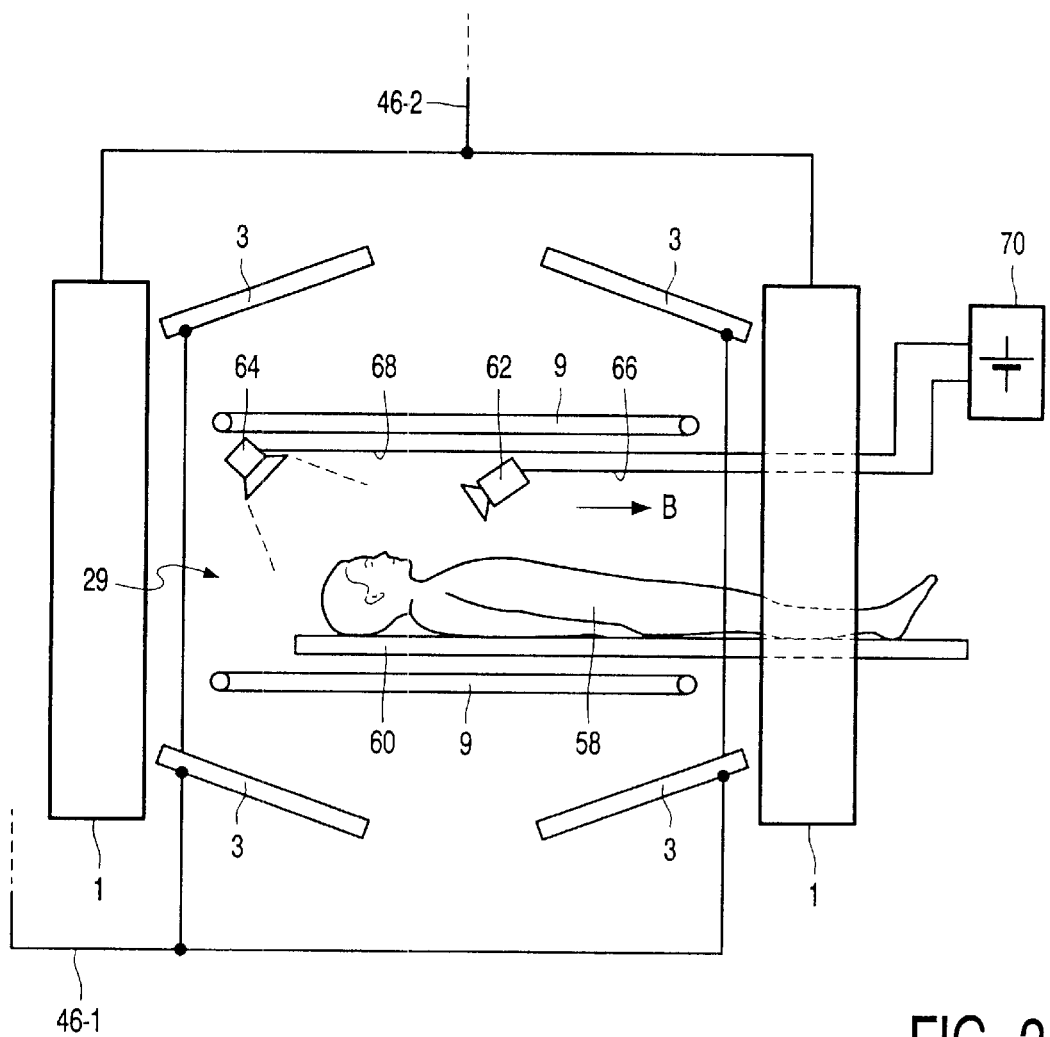
FIG. 2 is a more detailed representation of the measuring volume of the magnetic resonance imaging apparatus shown in FIG. 1.

FIG. 2 is a more detailed representation of the measuring volume of the MRI apparatus shown in FIG. 1. For the sake of clarity, this Figure shows only two coils of the first magnet system 1 for generating a uniform, steady magnetic field B. A patient 58 is arranged on a patient table 60 within the measuring volume 29 in such a manner that slice images can be formed of the head and the neck. Within or in the direct vicinity of the measuring volume 29 there is arranged electrical connection equipment for maintaining a connection with the patient to be examined, said equipment in this case being a TV camera 62 and a lamp 64 for illuminating the field of view of the camera. It is to be noted, however, that other electrical connection equipment may also be arranged within or near the measuring volume, for example sensors for measuring the blood pressure, the heart beat or the cerebral activity of the patient, or for carrying out two-way communication with the patient.

The television camera 62 and the lamp 64 receive power supply energy from the power supply apparatus 70 via a respective supply conductor 66, 68. The two supply conductors 66 and 68 extend through the uniform magnetic field B and through the RF field generated by the coils 9. According to the invention steps are taken so as to prevent the RF field generated by the coils 9 and/or the uniform magnetic field B from being disturbed so that the quality of the slice images to be formed by means of the MRI apparatus would be adversely affected. The supply conductors in which such steps are incorporated will be described in detail hereinafter with reference to FIG. 3.

Figure 3:
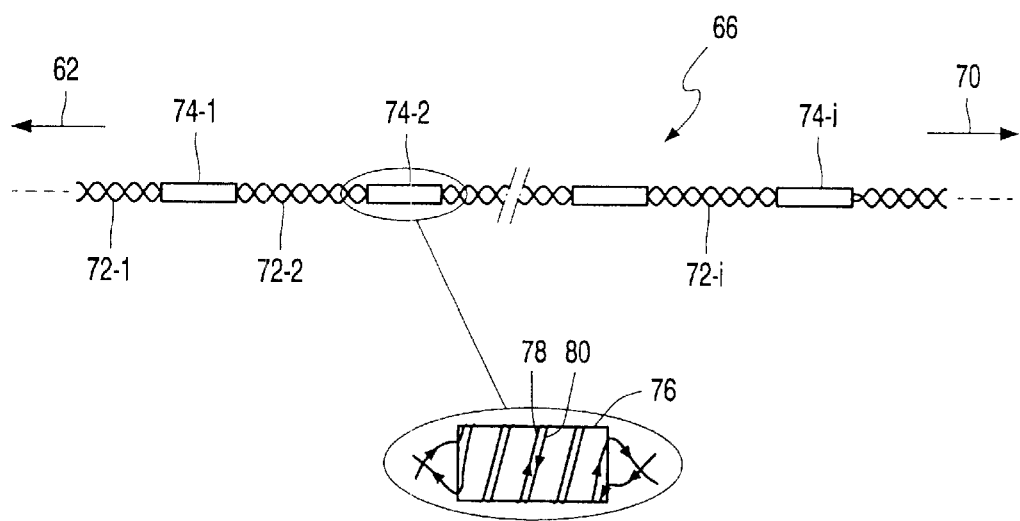
FIG. 3 is a diagrammatic representation of a low-frequency conductor according to the invention for delivering electrical low-frequency signals, such as power supply energy to connection equipment in the measuring volume, which low-frequency conductor is provided with inductance elements.

FIG. 3 shows a supply conductor, for example the supply conductor 66 for supplying the television camera with electrical power supply energy. This supply conductor 66 includes segments 72-1, 72-2, . . . 72-$i$, . . . which are separated from one another and each of which is shorter than one quarter of the wavelength of said RF radiation, preferably shorter than $1/20$ of said wavelength. The separation between the segments is realized by way of inductance elements 74-1, 74-2, . . . , 74-$i$, . . . As is known, inductance elements are frequency-dependent separating elements which constitute a conductor for direct current and an isolator for RF alternating current. The frequency used for the RF field generated by the coils 9 is of the order of some tens of MHz and typically amounts to, for example 64 MHz. This frequency corresponds to a wavelength of approximately 469 cm, so that the segments 72-$i$ have a length of approximately $469/20 \approx 23$ cm. Said segments are constructed in the form of two cores which are twisted one around the other, with the result that the supply current flowing through these cores does not generate a noticeable magnetic field outside the supply conductor.

FIG. 3 shows an inductance element in greater detail. Such inductance elements 74-$i$ are constructed as coils wound on a former 76 which does not interact with the RF field and with the uniform B field, so that this former cannot disturb said fields. A suitable material for such a coil former is, for example polycarbonate. The two cores 78 and 80 of the supply conductor are wound on the former 76 in such a manner that the magnetic fields generated by the current in these cores compensate one another to a high degree so that these coils do not generate a noticeable field. This effect is achieved by arranging the two cores directly adjacent one another on the former in such a manner that the currents in these two cores oppose one another. This is referred to as a bifilar winding. It is a further effect of the bifilar winding that the RF field cannot generate currents in the supply conductor, because the inductance has a high impedance for such currents (which would present themselves in the common mode, i.e. such currents would have the same direction in the two cores 78 and 80). As a result of said choice of the length of the segments, separated by inductances having a high impedance for said RF frequency, such segments cannot take up energy from the RF field so that they cannot noticeably disturb said field.

What is claimed is:
1. An MRI apparatus for forming an image of an object to be examined in a measuring volume of the MRI apparatus including anti-interference supply conductors, comprising:
 a field magnet for generating a uniform field in the measuring volume,
 an RF transmission aerial for transmitting RF radiation of a given wavelength to the object, and
 electrical connection equipment for maintaining a coupling to a region outside the measuring volume by means of an anti-interference supply conductor provided with frequency-dependent elements, wherein:
the anti-interference supply conductor comprises a low-frequency conductor for the supply of signals of low frequency, relative to the frequency of the RF radiation, to and from the connection equipment,
said low-frequency conductor including a plurality of alternating first and second elements wherein each said second element separates consecutive first elements; each said first element having a length shorter than ¼ of the wavelength of said RF radiation and comprising mutually twisted cores, and
each second element having a frequency-dependent separating element which constitutes a conductor for said low frequencies and an isolator for RF alternating current.

2. An MRI apparatus as claimed in claim 1, wherein each of the first elements is shorter than 1/20 of the wavelength of said RF radiation.

3. An MRI apparatus as claimed in claim 1, wherein the separating element is formed by an inductance element which does not contain ferromagnetic material.

4. An MRI apparatus as claimed in claim 3, wherein the inductance element is formed such that an input core and an output core in the conductor are wound to form bifilar wound coils.

5. An MRI apparatus as claimed in claim 1, wherein each core has first and second ends.

6. An MRI apparatus as claimed in claim 4, wherein the input and output cores each have first and second ends.

7. An MRI apparatus according to claim 1, wherein the mutually twisted cores comprise two cores which are twisted one around the other such that a supply current which flows through the two cores does not generate a noticeable magnetic field outside said low-frequency conductor.

8. An MRI apparatus for forming an image of an object to be examined in a measuring volume of the MRI apparatus and including anti-interference supply conductors, comprising:

a field magnet for generating a uniform field in the measuring volume, an RF transmission aerial for transmitting RF radiation of a given wavelength to the object, and electrical connection equipment for maintaining a coupling with a region outside the measuring volume by means of an anti-interference supply conductor provided with frequency-dependent elements, wherein:
the anti-interference supply conductor comprises a low-frequency conductor for the supply of signals of low frequency, relative to the frequency of the RF radiation, to and from the connection equipment,
said low-frequency conductor including a plurality of alternating first and second elements wherein each said second element separates consecutive first elements; each said first element having a length shorter than ¼ of the wavelength of said RF radiation, and comprising mutually twisted cores, wherein each core has first and second ends.

9. An MRI apparatus according to claim 8, wherein each second element has a frequency-dependent separating element which constitutes a conductor for said low frequencies and an isolator for RF alternating current.

10. An MRI apparatus as claimed in claim 8, wherein each of the first elements is shorter than 1/20 of the wavelength of said RF radiation.

11. An MRI apparatus as claimed in claim 8, wherein the mutually twisted cores comprise two cores which are twisted one around the other such that a supply current which flows through the two cores does not generate a noticeable magnetic field outside said low-frequency conductor.

* * * * *